(12) United States Patent
Baba

(10) Patent No.: US 11,101,388 B2
(45) Date of Patent: Aug. 24, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Hirofumi Baba, Kitakami Iwate (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/571,585

(22) Filed: Sep. 16, 2019

(65) Prior Publication Data

US 2020/0303566 A1  Sep. 24, 2020

(30) Foreign Application Priority Data

Mar. 20, 2019  (JP) .............................. JP2019-052785

(51) Int. Cl.
*H01L 21/02* (2006.01)
*H01L 31/02* (2006.01)
*H01L 31/18* (2006.01)
*H01L 31/0216* (2014.01)

(52) U.S. Cl.
CPC .... *H01L 31/02005* (2013.01); *H01L 31/1804* (2013.01); *H01L 31/02162* (2013.01)

(58) Field of Classification Search
CPC ......... H01L 31/02005; H01L 21/02063; H01L 31/102162; H01L 31/1804
See application file for complete search history.

(56) References Cited

U.S. PATENT DOCUMENTS

| 6,815,824 B2 | 11/2004 | Shioya et al. |
| 7,192,891 B2* | 3/2007 | Goo ................. H01L 21/02222 438/782 |
| 9,972,600 B2 | 5/2018 | Tsukiyama et al. |

(Continued)

FOREIGN PATENT DOCUMENTS

| JP | 2003-68850 A | 3/2003 |
| JP | 3745257 B2 | 2/2006 |
| JP | 6276151 B2 | 2/2018 |

OTHER PUBLICATIONS

Woo Sik Yoo, Takashi Fukada, Yasuhide Hiraga, Kitaek Kang and Jiro Yamamoto, "Spin-On-Glass Bake And Cure Using A Resitively Heated Batch Annealing Oven", Electrochemical Society, published article; Jan. 2001, (7) seven pages. (Year: 2001).*

*Primary Examiner* — William Coleman
(74) *Attorney, Agent, or Firm* — White & Case LLP

(57) ABSTRACT

A semiconductor device of an embodiment includes a semiconductor layer having a first plane, a second plane, and a through hole penetrating from the first plane to the second plane; an insulating layer on a side of the second plane of the semiconductor layer; a first conductive layer in the insulating layer; a silicon oxide layer on a side of the first plane and in the through hole; a silicon nitride layer provided on the side of the first plane and in the through hole, the silicon oxide layer being interposed between the silicon nitride layer and the semiconductor layer; and a second conductive layer on the side of the first plane and in the through hole, the silicon oxide layer and the silicon nitride layer being interposed between the second conductive layer and the semiconductor layer, and the second conductive layer electrically connected to the first conductive layer.

15 Claims, 14 Drawing Sheets

(56) References Cited

U.S. PATENT DOCUMENTS

| | | | |
|---|---|---|---|
| 10,388,592 B2* | 8/2019 | Oshige | H01L 23/481 |
| 10,643,926 B2* | 5/2020 | Choi | H01L 21/76898 |
| 2005/0003660 A1 | 1/2005 | Murakawa et al. | |
| 2018/0152657 A1* | 5/2018 | Miyazawa | H01L 27/14636 |

* cited by examiner

SEMICONDUCTOR DEVICE

CROSS-REFERENCE TO RELATED APPLICATION

This application is based upon and claims the benefit of priority from Japanese Patent Application No. 2019-052785, filed on Mar. 20, 2019, the entire contents of which are incorporated herein by reference.

FIELD

Embodiments described here in relate generally to a semiconductor device.

BACKGROUND

Through silicon vias (TSV) are used in order for an element formed on the front face of a semiconductor chip to obtain electrical connection from the rear face side of the semiconductor chip. With TSVs, it is possible, for example, to reduce the mounting area required for mounting a semiconductor chip on a circuit board. Thus, it is possible to miniaturize the circuit board.

In order to use TSVs, additional structures, such as a through hole provided in a silicon layer of a semiconductor chip and an insulating layer for insulating the TSVs from the silicon layer, need to be introduced. It is required that the additional structures do not degrade the reliability of the semiconductor chip.

DETAILED DESCRIPTION

Figure 1:
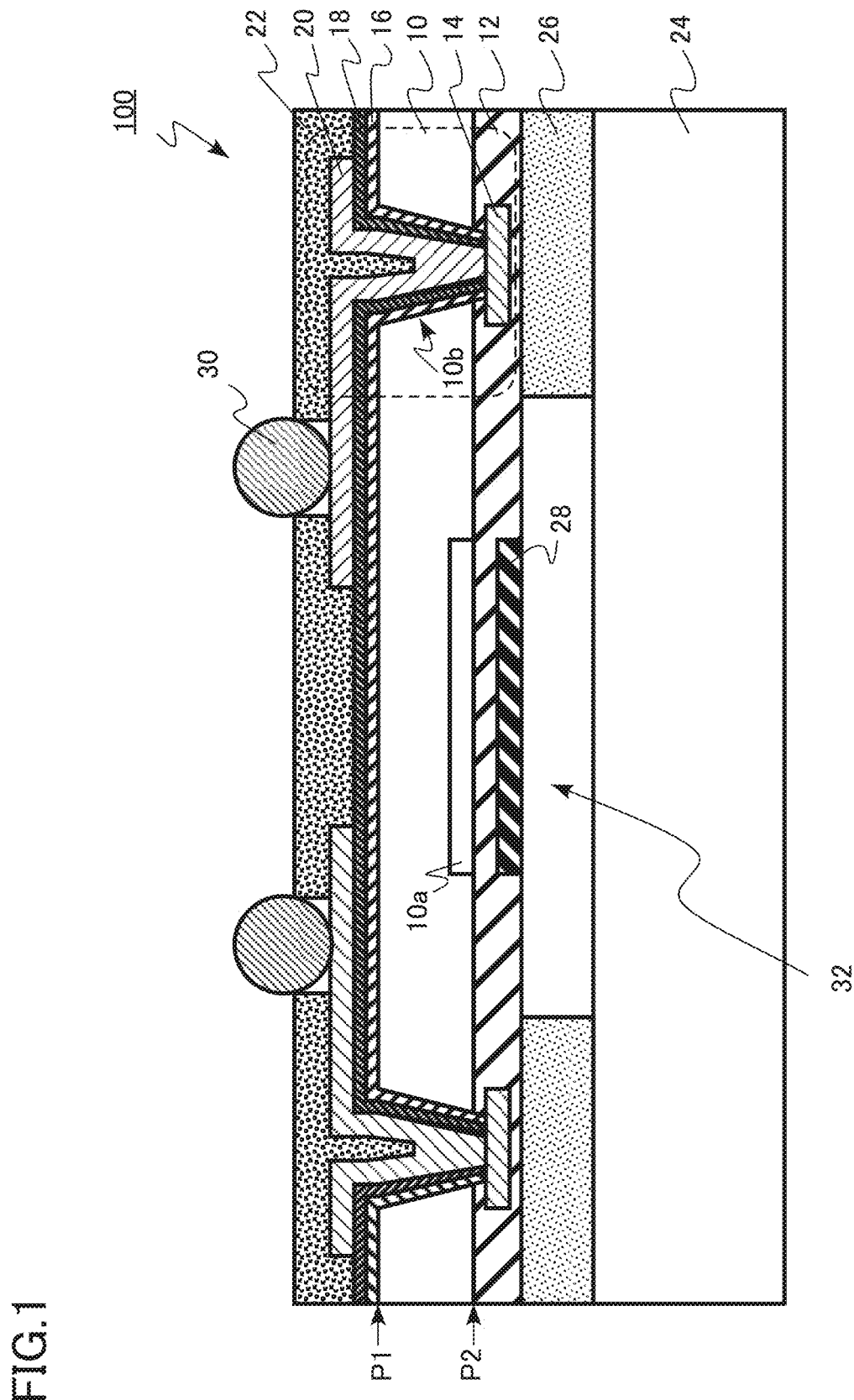
FIG. 1 is a schematic sectional view of a semiconductor device of an embodiment.

A semiconductor device in an aspect of the present disclosure includes a semiconductor layer having a first plane, a second plane, and a through hole penetrating from the first plane to the second plane; an insulating layer provided on a side of the second plane of the semiconductor layer; a first conductive layer provided in the insulating layer; a silicon oxide layer provided on a side of the first plane and in the through hole of the semiconductor layer; a silicon nitride layer provided on the side of the first plane and in the through hole of the semiconductor layer, the silicon oxide layer being interposed between the silicon nitride layer and the semiconductor layer; and a second conductive layer provided on the side of the first plane and in the through hole of the semiconductor layer, the silicon oxide layer and the silicon nitride layer being interposed between the second conductive layer and the semiconductor layer, and the second conductive layer electrically connected to the first conductive layer.

In this specification, the same or similar members are denoted by the same reference signs, and duplicate descriptions can be omitted.

In this specification, the upper part of the drawing may be described as "upper" and the lower part of the drawing as "lower" to indicate the positional relation of parts or the like. In the present specification, the terms "upper" and "lower" do not necessarily indicate the relation with the gravity direction.

In order to perform qualitative analysis and quantitative analysis for the chemical composition of members constituting a semiconductor device in this specification, secondary ion mass spectrometry (SIMS) and energy dispersive X-ray spectroscopy (EDX) can be used, for example. In addition, in order to measure the thickness of the members constituting the semiconductor device, the distance between members, and the like, a scanning electron microscope (SEM) or a transmission electron microscope (TEM) can be used, for example. Furthermore, in order to measure the magnitude relation of the thickness of the members constituting the semiconductor device, a three-dimensional atom probe can be used, for example.

A semiconductor device of an embodiment includes a semiconductor layer including a first plane, a second plane, and a through hole penetrating from the first plane to the second plane, an insulating layer provided on a side of the second plane of the semiconductor layer, a first conductive layer provided in the insulating layer, a silicon oxide layer provided on a side of the first plane of the semiconductor layer and in the through hole, a silicon nitride layer provided on the side of the first plane of the semiconductor layer and in the through hole in a manner such that the silicon oxide layer is sandwiched between the silicon nitride layer and the semiconductor layer, and a second conductive layer provided on the side of the first plane of the semiconductor layer and in the through hole in a manner such that the silicon oxide layer and the silicon nitride layer are sandwiched between the second conductive layer and the semiconductor layer, and electrically connected with first conductive layer.

FIG. 1 is a schematic sectional view of a semiconductor device of an embodiment. The semiconductor device of the embodiment is a photosensor 100 having a TSV structure. In a sensor region provided on one side of a semiconductor layer, the TSV structure is provided in order to obtain electrical connection from the other side of the semiconductor layer.

Figure 2:
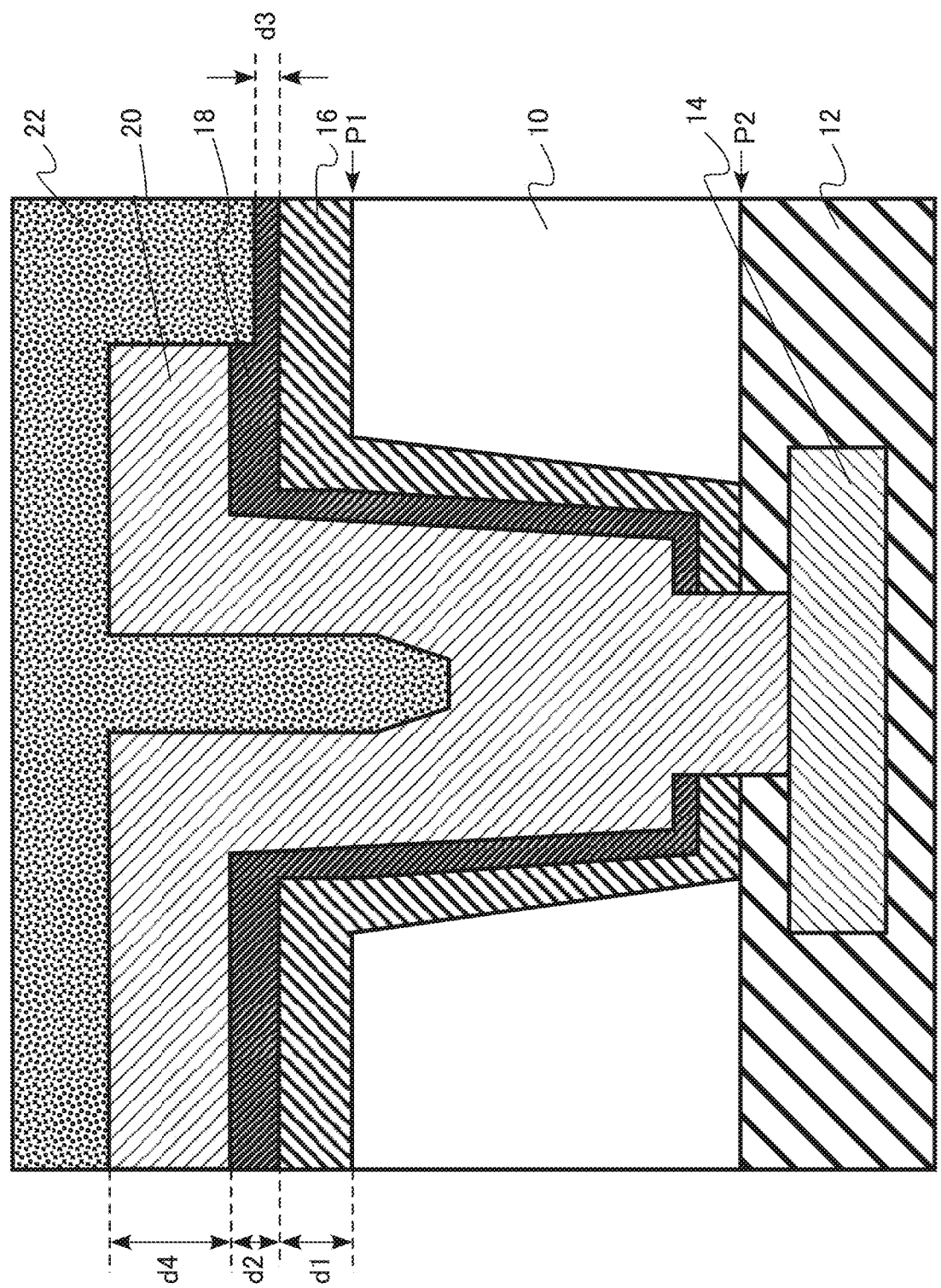
FIG. 2 is an enlarged schematic sectional view of a part of the semiconductor device of the embodiment.

FIG. 2 is an enlarged schematic sectional view of a part of the semiconductor device of the embodiment. FIG. 2 is a sectional view of the TSV structure (the portion surrounded by a dotted frame in FIG. 1) of the photosensor 100.

The photosensor 100 includes a silicon layer 10 (semiconductor layer), an insulating layer 12, a pad layer 14 (first conductive layer), a silicon oxide layer 16, a silicon nitride layer 18, a wiring layer 20 (second conductive layer), and a protective resin layer 22 (first resin layer), a glass substrate 24 (transparent substrate), an adhesive layer 26 (second resin layer), a color filter 28, a solder ball 30, and a cavity 32. The silicon layer 10 includes a photodiode 10a and a through hole 10b.

The silicon layer 10 has a first plane (P1) and a second plane (P2). The silicon layer 10 is an example of a semiconductor layer.

The photodiode 10a is formed on the second plane P2 side of the silicon layer 10. The photodiode 10a includes a pn junction formed in the silicon layer 10.

The silicon layer 10 is provided with the through hole 10b penetrating from the first plane P1 to the second plane P2. The TSV structure is formed using the through hole 10b.

The silicon layer 10 is, for example, single crystal silicon. The thickness of the silicon layer 10 is, for example, 50 μm or more and 100 μm or less.

The color filter 28 is provided between the photodiode 10a and the glass substrate 24. The color filter 28 is formed of, for example, resin. The photodiode 10a and the color filter 28 constitute a sensor region of the photosensor 100.

The insulating layer 12 is provided between the silicon layer 10 and the glass substrate 24. In the insulating layer 12, for example, a multilayer wiring layer (not illustrated) connected to the sensor region is formed. The insulating layer 12 is, for example, silicon oxide.

The pad layer 14 is provided in the insulating layer 12. The pad layer 14 is connected to, for example, the multilayer wiring layer (not illustrated) connected to the sensor region.

The pad layer 14 is, for example, metal. The pad layer 14 is, for example, an aluminum alloy.

The silicon oxide layer 16 is provided on the first plane P1 side and in the through hole 10b of the silicon layer 10. The silicon oxide layer 16 is formed on the silicon layer 10. The silicon oxide layer 16 is, for example, in contact with the silicon layer 10. The silicon oxide layer 16 has a function of electrically insulating the silicon layer 10 from the wiring layer 20.

The silicon oxide layer 16 is, for example, a film formed using a plasma deposition apparatus. The silicon oxide layer 16 is, for example, a film formed at a deposition temperature of 250° C. or less. The thickness of the silicon oxide layer 16 (d1 in FIG. 2) is, for example, 2 μm or more and 5 μm or less.

The silicon nitride layer 18 is provided on the first plane P1 side and in the through hole 10b of the silicon layer 10. The silicon nitride layer 18 is provided so that the silicon oxide layer 16 is sandwiched between the silicon nitride layer 18 and the silicon layer 10. The silicon nitride layer 18 is formed on the silicon oxide layer 16. The silicon nitride layer 18 is, for example, in contact with the silicon oxide layer 16. The silicon nitride layer 18 has a function of blocking the passage of moisture.

The silicon nitride layer 18 is, for example, a film formed using a plasma deposition apparatus. The silicon nitride layer 18 is, for example, a film formed at a deposition temperature of 250° C. or less. The thickness of the silicon nitride layer 18 (d2 in FIG. 2) is, for example, thinner than the thickness of the silicon oxide layer 16. The thickness of the silicon nitride layer 18 is, for example, 0.1 μm or more and 1 μm or less.

The thickness of the silicon nitride layer 18 at the portion where the protective resin layer 22 is in contact with the silicon nitride layer 18 (d3 in FIG. 2) is, for example, thinner than the thickness of the silicon nitride layer 18 at the portion where the wiring layer 20 is in contact with the silicon nitride layer 18 (d2 in FIG. 2).

The wiring layer 20 is provided on the first plane P1 side and in the through hole 10b of the silicon layer 10. The wiring layer 20 is provided so that the silicon oxide layer 16 and the silicon nitride layer 18 are sandwiched between the wiring layer 20 and the silicon layer 10. The wiring layer 20 is formed, for example, on the silicon nitride layer 18. The wiring layer 20 is, for example, in contact with the silicon nitride layer 18.

The wiring layer 20 is electrically connected to the pad layer 14. The wiring layer 20 constitutes the TSV structure.

The wiring layer 20 is, for example, metal. The wiring layer 20 contains, for example, at least one metal element selected from copper (Cu), gold (Au), and silver (Ag). The wiring layer 20 is, for example, copper (Cu). The wiring layer 20 is, for example, copper (Cu) formed using an electrolytic plating method.

The thickness of the wiring layer 20 (d4 in FIG. 2) is, for example, 5 μm or more and 20 μm or less.

The protective resin layer 22 is provided on the first plane P1 side of the silicon layer 10. The protective resin layer 22 is provided so that the silicon oxide layer 16, the silicon nitride layer 18, and the wiring layer 20 are sandwiched between the protective resin layer 22 and the silicon layer 10. The protective resin layer 22 is formed on the wiring layer 20.

The protective resin layer 22 has a function of protecting the wiring layer 20. The protective resin layer 22 is resin. The protective resin layer 22 is, for example, a solder resist.

The solder ball 30 is provided at an opening of the protective resin layer 22. The solder ball 30 is in contact with the wiring layer 20. The solder ball 30 has a function of mounting the photosensor 100 on a circuit board.

The glass substrate 24 is provided on the second plane P2 side of the silicon layer 10. The glass substrate 24 is provided so that the insulating layer 12 is sandwiched between the glass substrate 24 and the silicon layer 10. The glass substrate 24 is an example of a transparent substrate.

The cavity 32 is provided between the glass substrate 24 and the photodiode 10a. The glass substrate 24 transmits light from the outside of the photosensor 100 in order for the photodiode 10a to be irradiated with the transmitted light through the color filter 28.

The thickness of the glass substrate 24 is, for example, 250 μm or more and 450 μm or less.

The adhesive layer 26 is provided between the glass substrate 24 and the insulating layer 12. The adhesive layer 26 has a function of bonding the glass substrate 24 and the insulating layer 12. For example, a portion where the adhesive layer 26 is not provided between the glass substrate 24 and the insulating layer 12 is the cavity 32.

The adhesive layer 26 is, for example, a resin adhesive. The thickness of the adhesive layer 26 is, for example, 30 µm or more and 80 µm or less.

Next, a method for manufacturing the semiconductor device of the embodiment will be described. The method for manufacturing the semiconductor device of the embodiment is a method for manufacturing the photosensor 100 having the TSV structure.

FIGS. 3, 4, 5, 6, 7, 8, 9, 10, 11, and 12 are schematic sectional views illustrating the manufacturing method for the semiconductor device of the embodiment. FIGS. 3, 4, 5, 6, 7, 8, 9, 10, 11, and 12 are sectional views of the TSV structure of the photosensor 100.

First, the photodiode 10a is formed in the silicon layer 10 using a known manufacturing method. The insulating layer 12, the pad layer 14, a transistor (not illustrated), a multi-layer wiring layer (not illustrated), the color filters 28, and the like are further formed on the silicon layer 10. Then, the glass substrate 24 is bonded to the insulating layer 12 using the adhesive layer 26.

Figure 3:
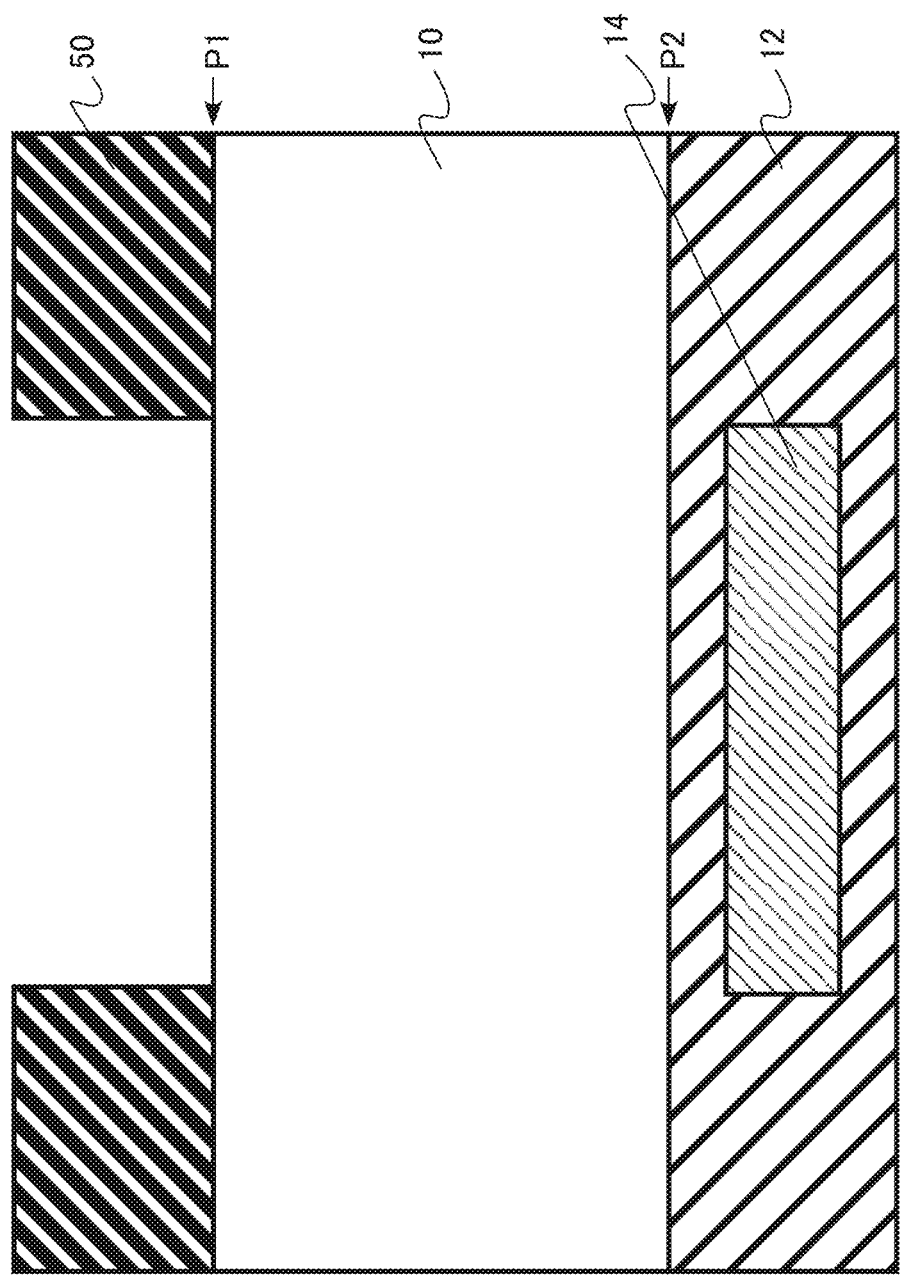
FIG. 3 is a schematic sectional view illustrating a method for manufacturing the semiconductor device of the embodiment.

Next, the silicon layer 10 is ground to a desired thickness from the first plane P1 side of the silicon layer 10, that is, the side opposite to the glass substrate 24. Then, a resist layer 50 patterned using a known lithography method is formed on the first plane P1 side of the silicon layer 10 (FIG. 3).

Figure 4:
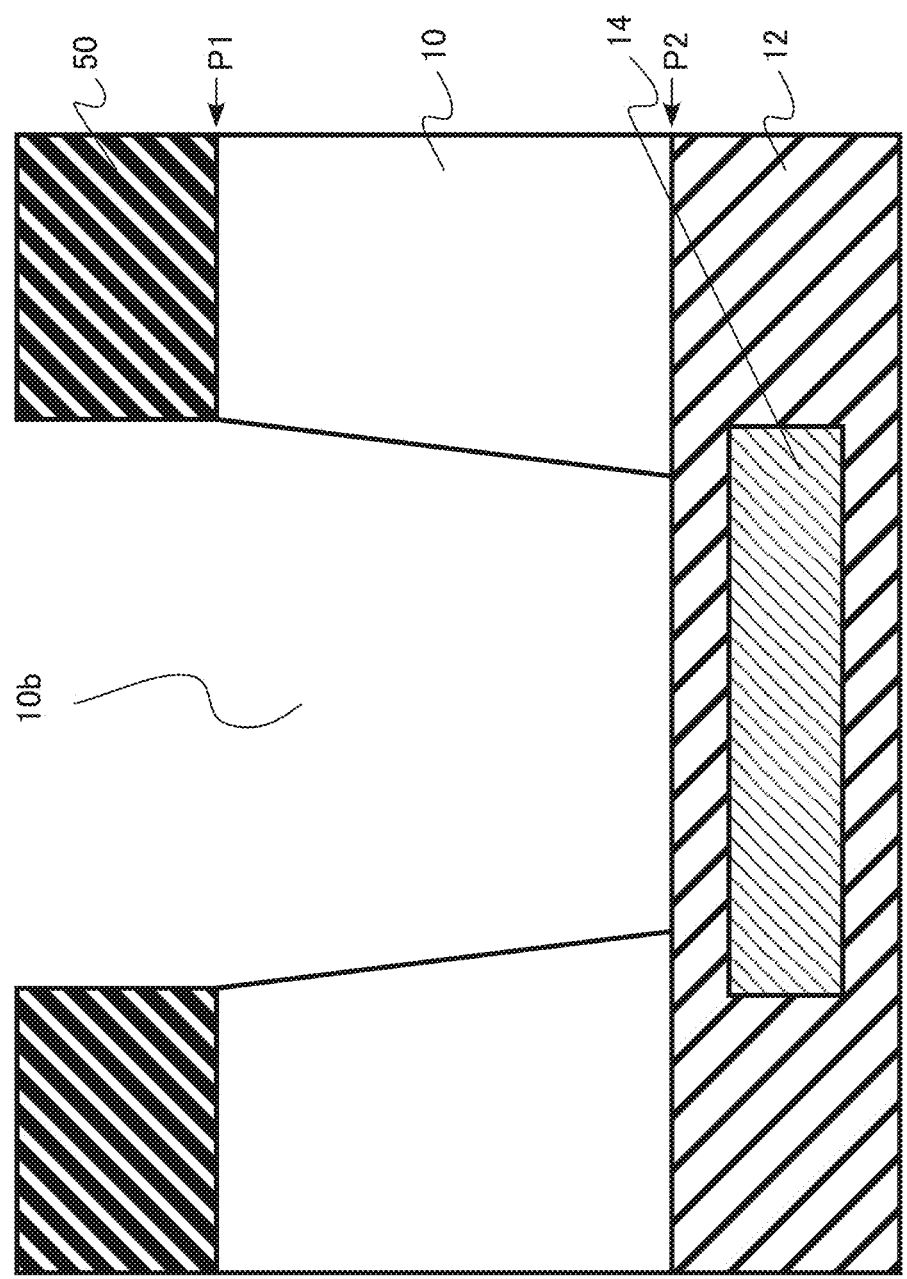
FIG. 4 is a schematic sectional view illustrating the method for manufacturing the semiconductor device of the embodiment.
Figure 5:
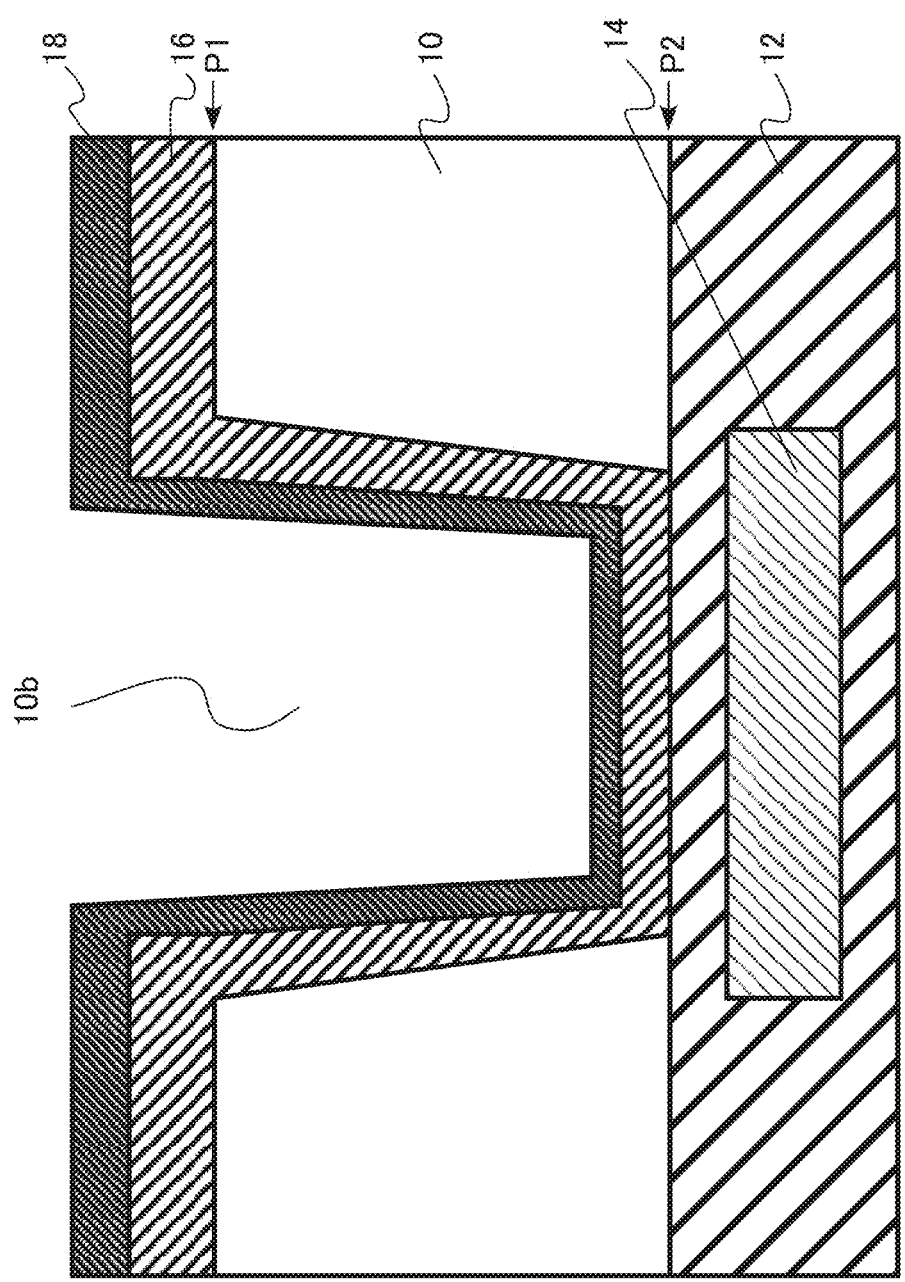
FIG. 5 is a schematic sectional view illustrating the method for manufacturing the semiconductor device of the embodiment.

Next, the through hole 10b is formed in the silicon layer 10 by reactive ion etching (RIE) using the resist layer 50 as a mask (FIG. 4). The through hole 10b reaches the insulating layer 12. The diameter of the through hole 10b is, for example, 50 µm or more and 100 µm or less.

Next, the resist layer 50 is removed, and, then, the silicon oxide layer 16 is formed on the silicon layer 10 and in the through hole 10b. The silicon oxide layer 16 is, for example, formed using a plasma deposition apparatus. The silicon oxide layer 16 is, for example, formed at a deposition temperature of 250° C. or less.

Next, the silicon nitride layer 18 is formed on the silicon oxide layer 16 and in the through hole 10b (FIG. 5) The silicon nitride layer 18 is, for example, formed using a plasma deposition apparatus. The silicon oxide layer 16 is, for example, formed at a deposition temperature of 250° C. or less.

Figure 6:
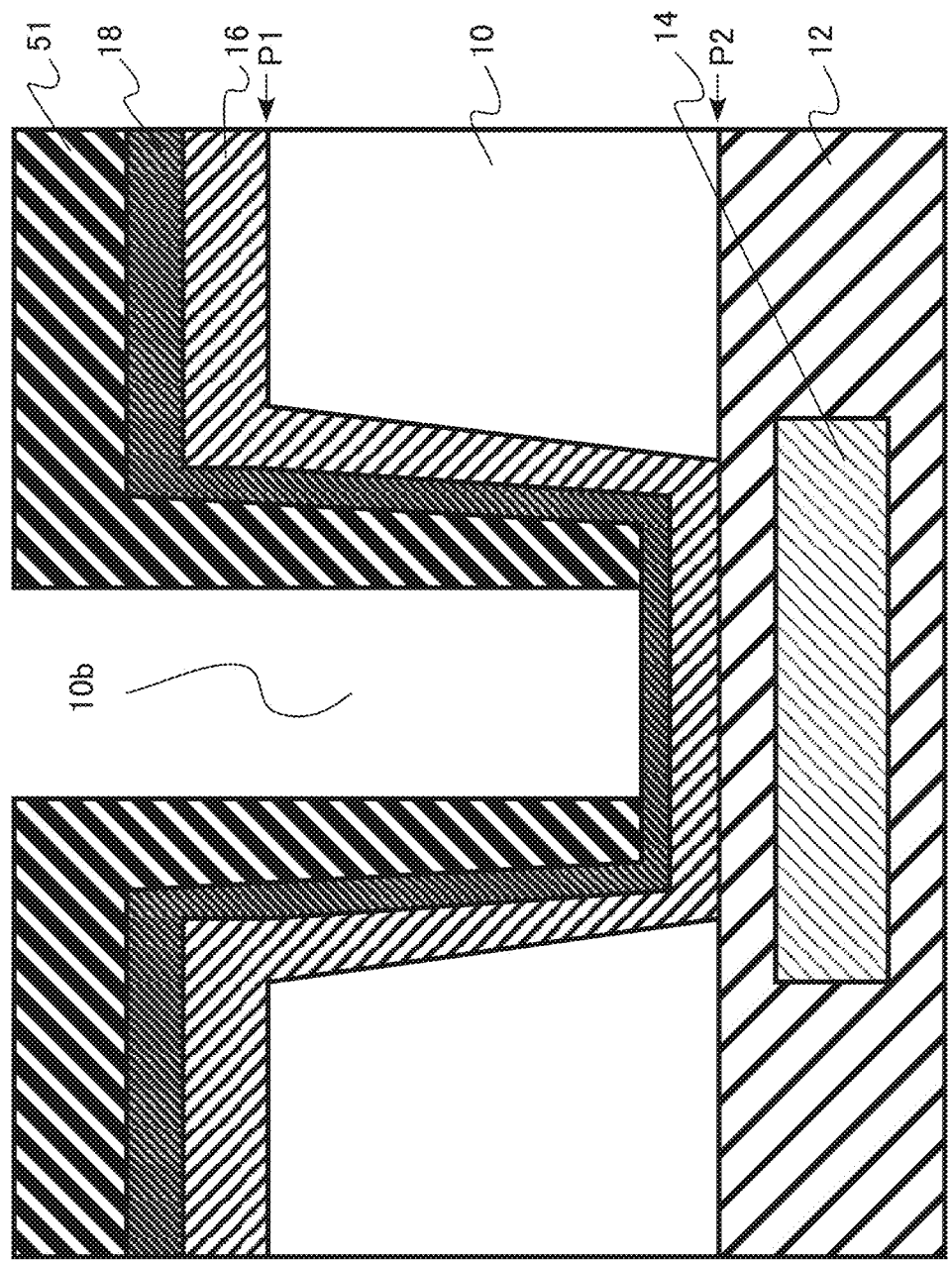
FIG. 6 is a schematic sectional view illustrating the method for manufacturing the semiconductor device of the embodiment.

Next, a resist layer 51 patterned using a known lithography method is formed on the silicon nitride layer 18 (FIG. 6). The resist layer 51 is formed so as to have an opening inside the through hole 10b.

Figure 7:
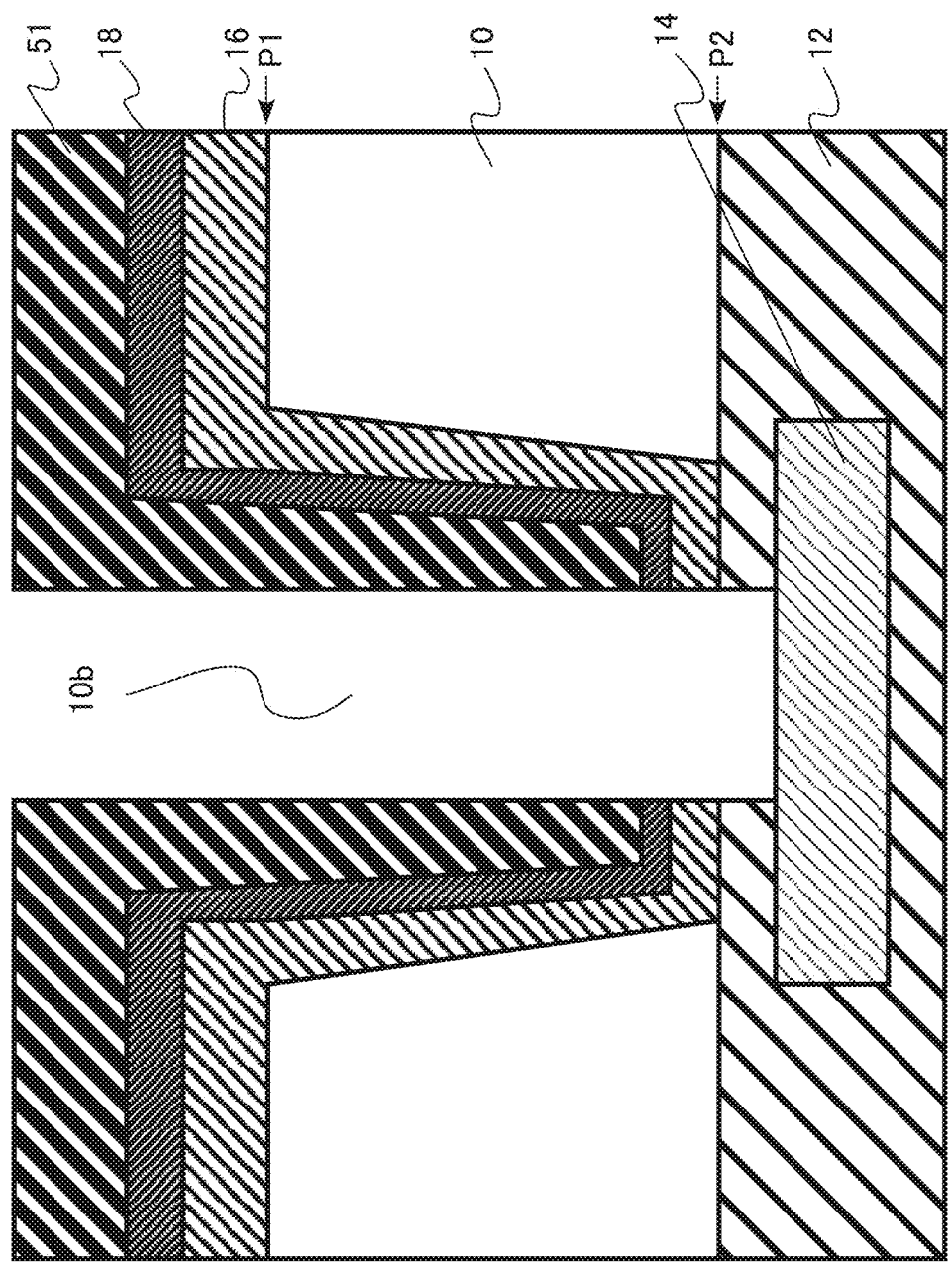
FIG. 7 is a schematic sectional view illustrating the method for manufacturing the semiconductor device of the embodiment.

Next, the silicon nitride layer 18, the silicon oxide layer 16, and the insulating layer 12 formed at the bottom of the through hole 10b are removed by, for example, RIE using the resist layer 51 as a mask (FIG. 7). The pad layer 14 is exposed at the bottom of the through hole 10b.

Figure 8:
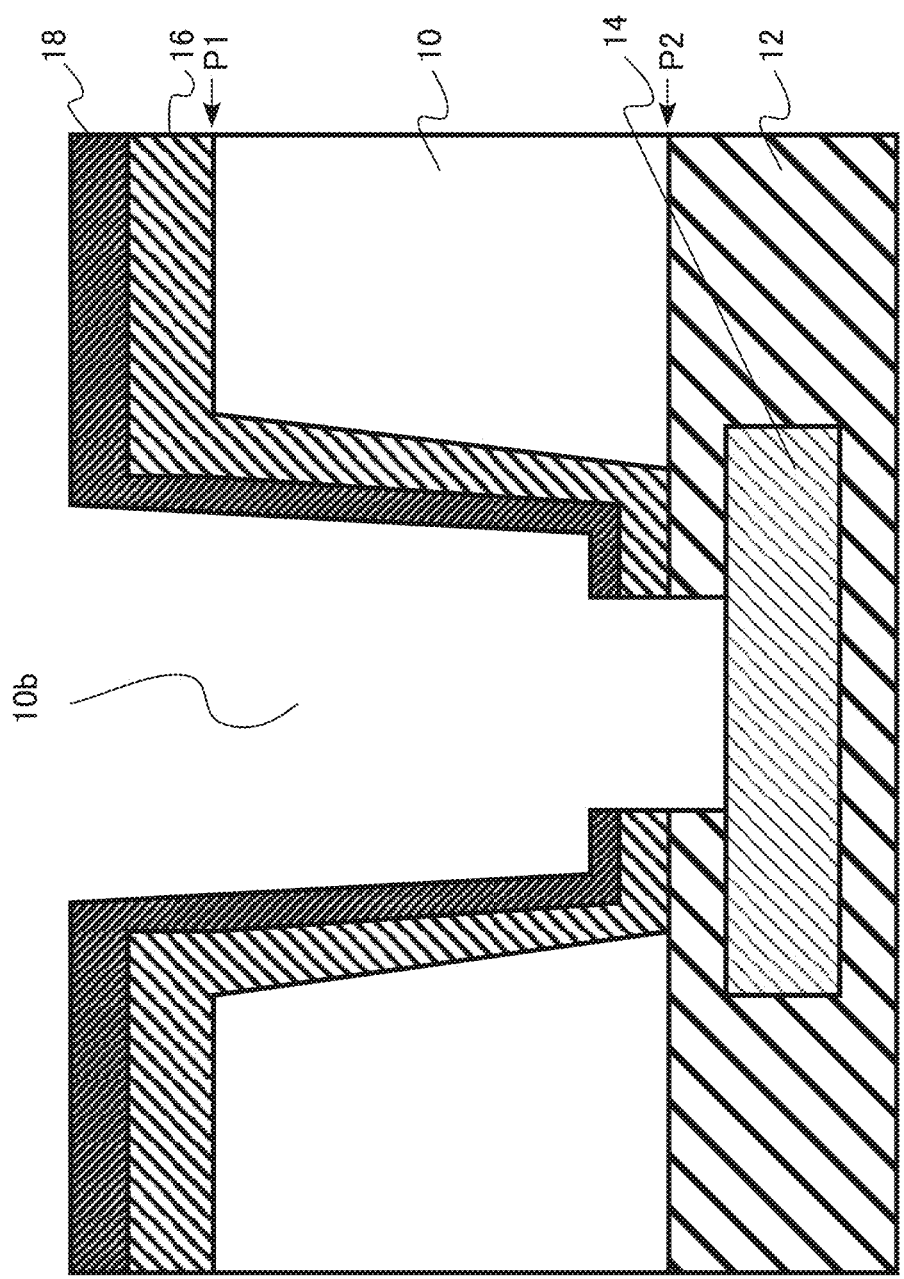
FIG. 8 is a schematic sectional view illustrating the method for manufacturing the semiconductor device of the embodiment.

Next, the resist layer 51 is removed (FIG. 8).

Figure 9:
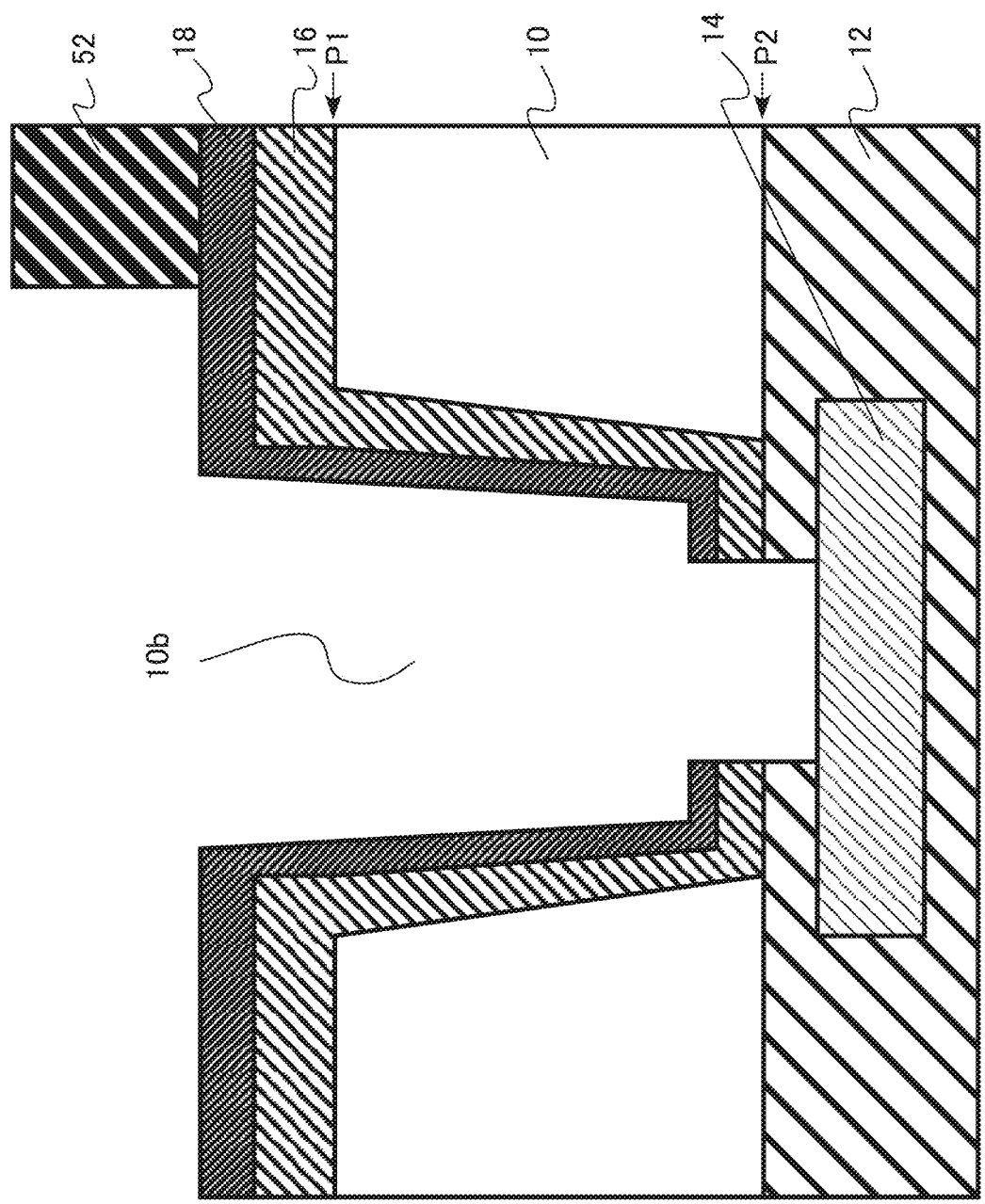
FIG. 9 is a schematic sectional view illustrating the method for manufacturing the semiconductor device of the embodiment.

Next, a titanium film (not illustrated) and a copper film (not illustrated) are formed on the silicon nitride layer 18 by, for example, sputtering. The titanium film and the copper film serve as a seed film when the wiring layer 20 is formed by electrolytic plating. Next, a patterned resist layer 52 is formed on the titanium film and the copper film (FIG. 9).

Figure 10:
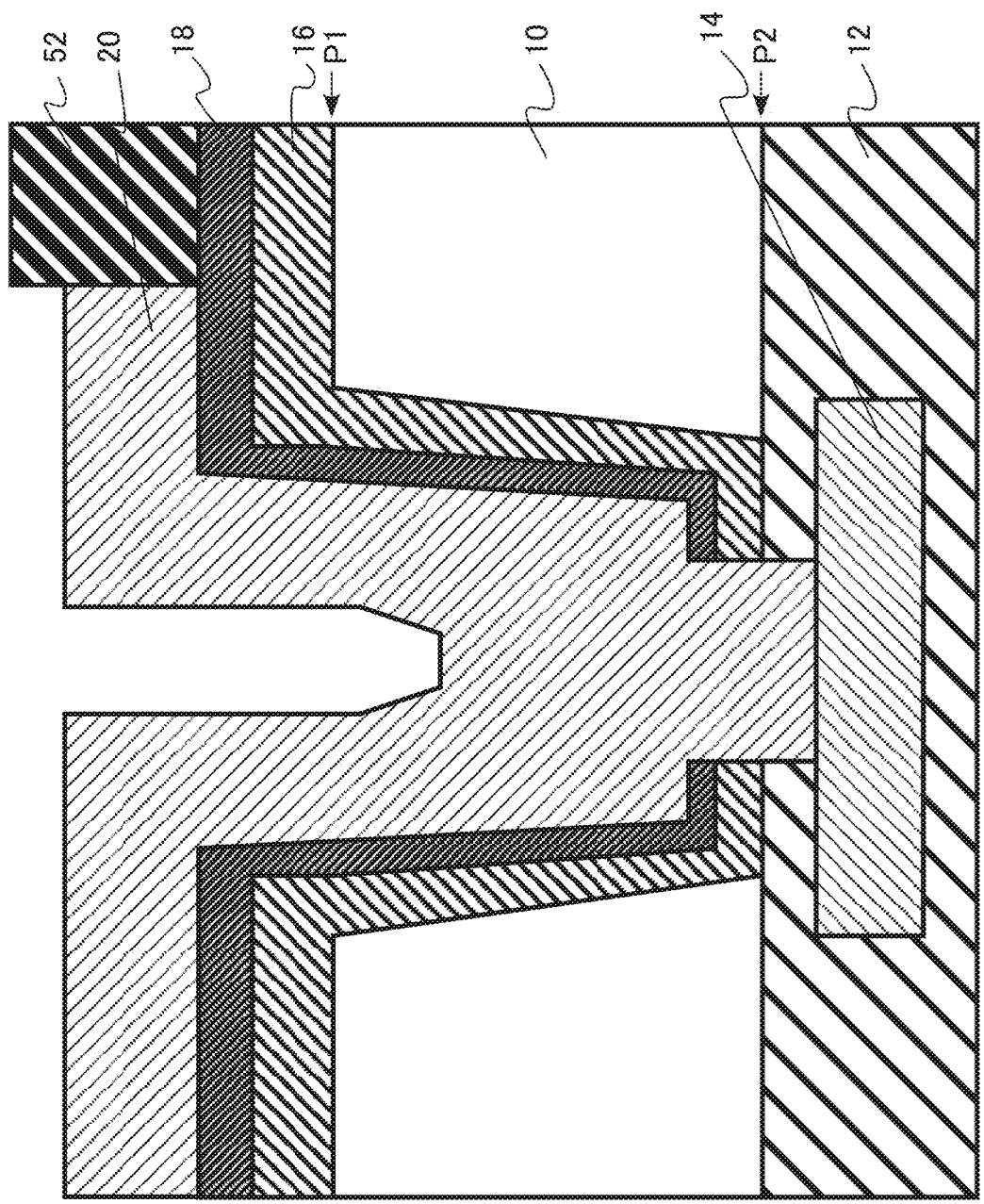
FIG. 10 is a schematic sectional view illustrating the method for manufacturing the semiconductor device of the embodiment.

Next, the wiring layer 20 is formed by electrolytic plating on the titanium film and the copper film that are not covered by the resist layer 52 (FIG. 10).

Figure 11:
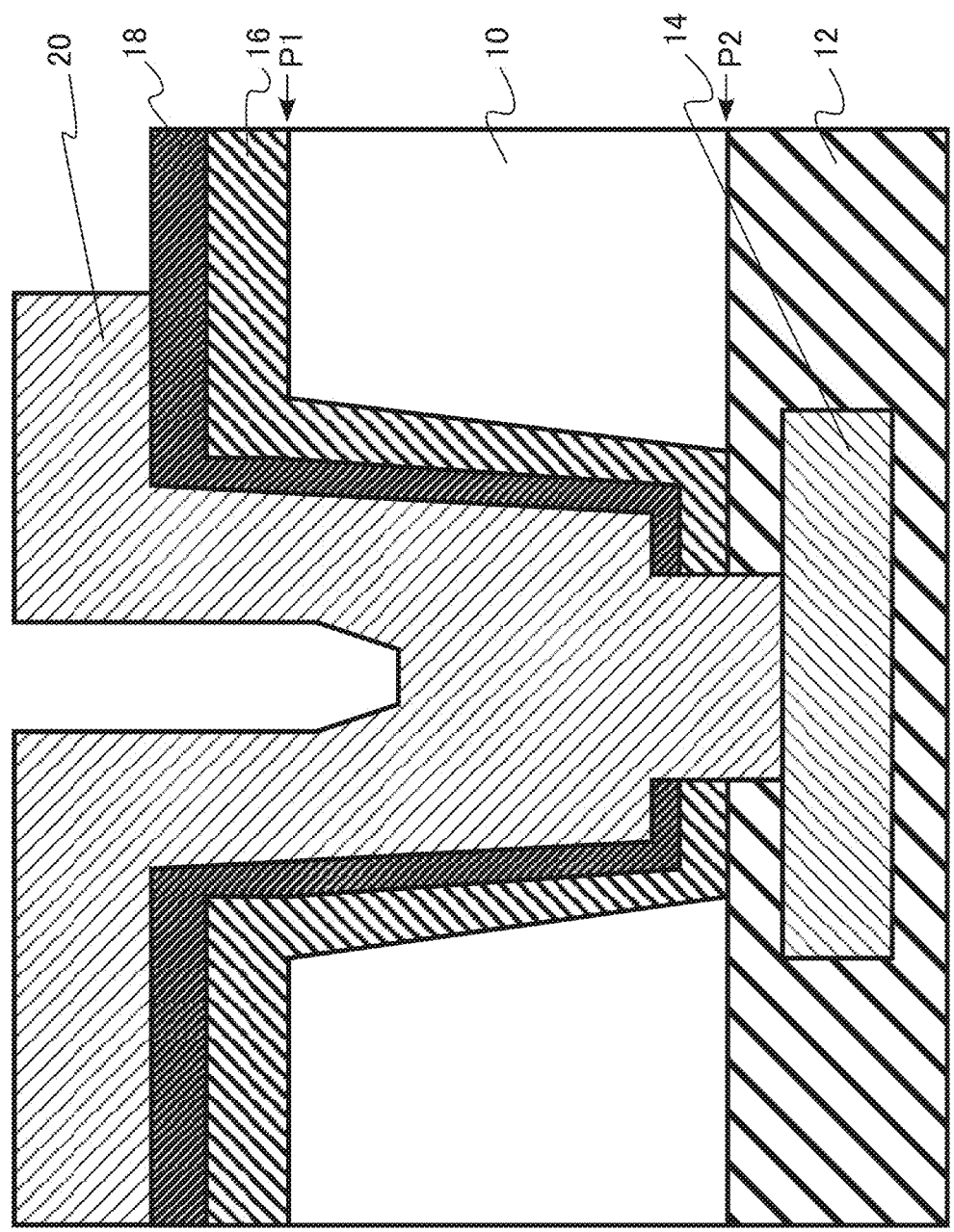
FIG. 11 is a schematic sectional view illustrating the method for manufacturing the semiconductor device of the embodiment.

Next, the resist layer 52 is removed (FIG. 11)

Figure 12:
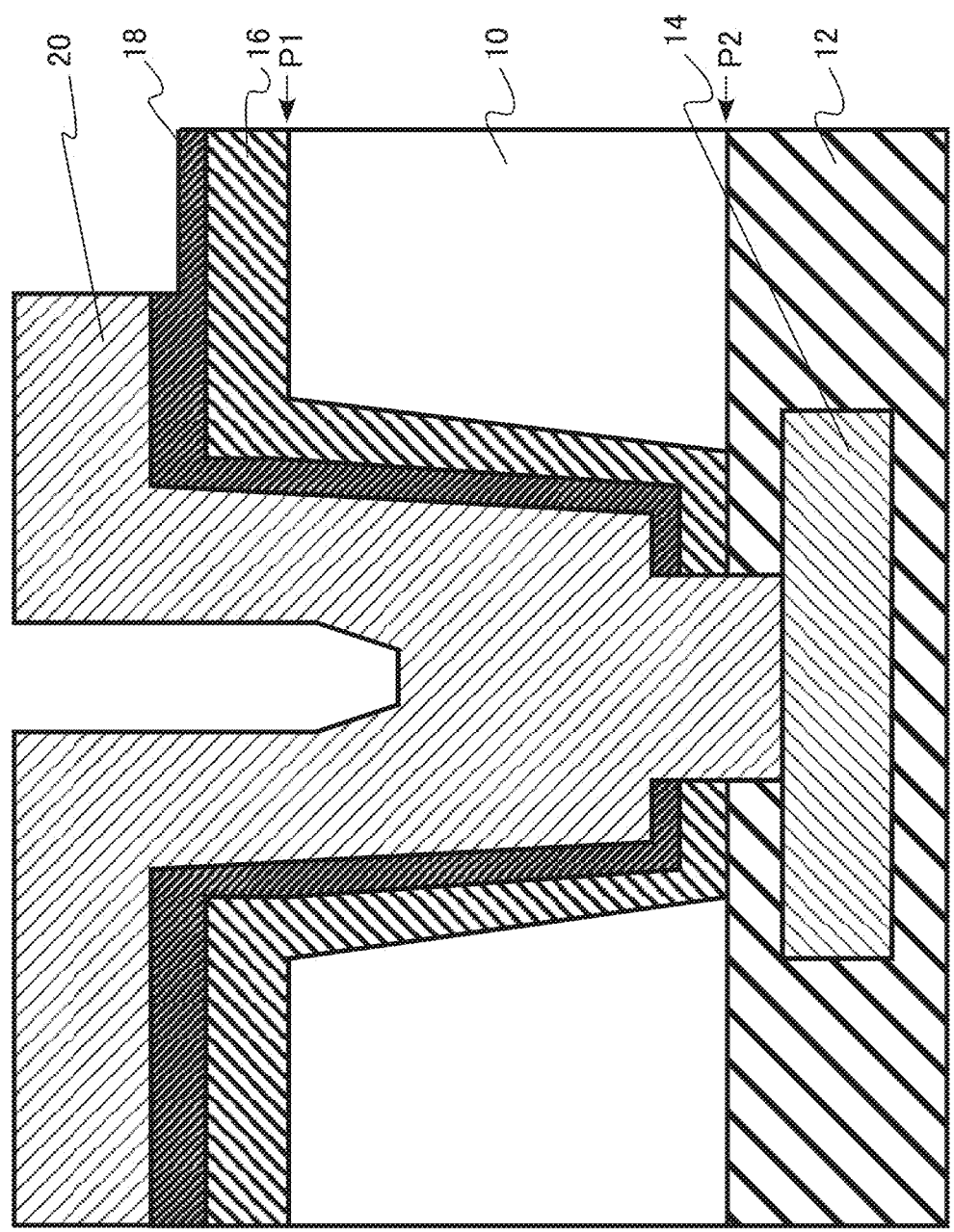
FIG. 12 is a schematic sectional view illustrating the method for manufacturing the semiconductor device of the embodiment.

Next, the titanium film and the copper film that are covered by the resist layer 52 are removed by wet etching (FIG. 12). During the wet etching, a part of the front face of the silicon nitride layer 18 is removed.

Then, the patterned protective resin layer 22 is formed. Next, the solder ball 30 is formed on the wiring layer 20 exposed from the protective resin layer 22.

The photosensor 100 illustrated in FIG. 1 is formed by the above manufacturing method.

In the following, the function and effect of the semiconductor device of the present embodiment will be described.

In order for an element formed on the front face of a semiconductor chip to obtain electrical connection from the rear face side of the semiconductor chip, a silicon through electrode is used. With TSVs, it is possible, for example, to reduce the mounting area required for mounting a semiconductor chip on a circuit board. Thus, it is possible to miniaturize the circuit board.

In order to use TSVs, additional structures, such as a through hole provided in a silicon layer of a semiconductor chip and an insulating layer for insulating the TSVs from the silicon layer, are added. It is required that the addition of the structures does not degrade the reliability of the semiconductor chip.

Figure 13:
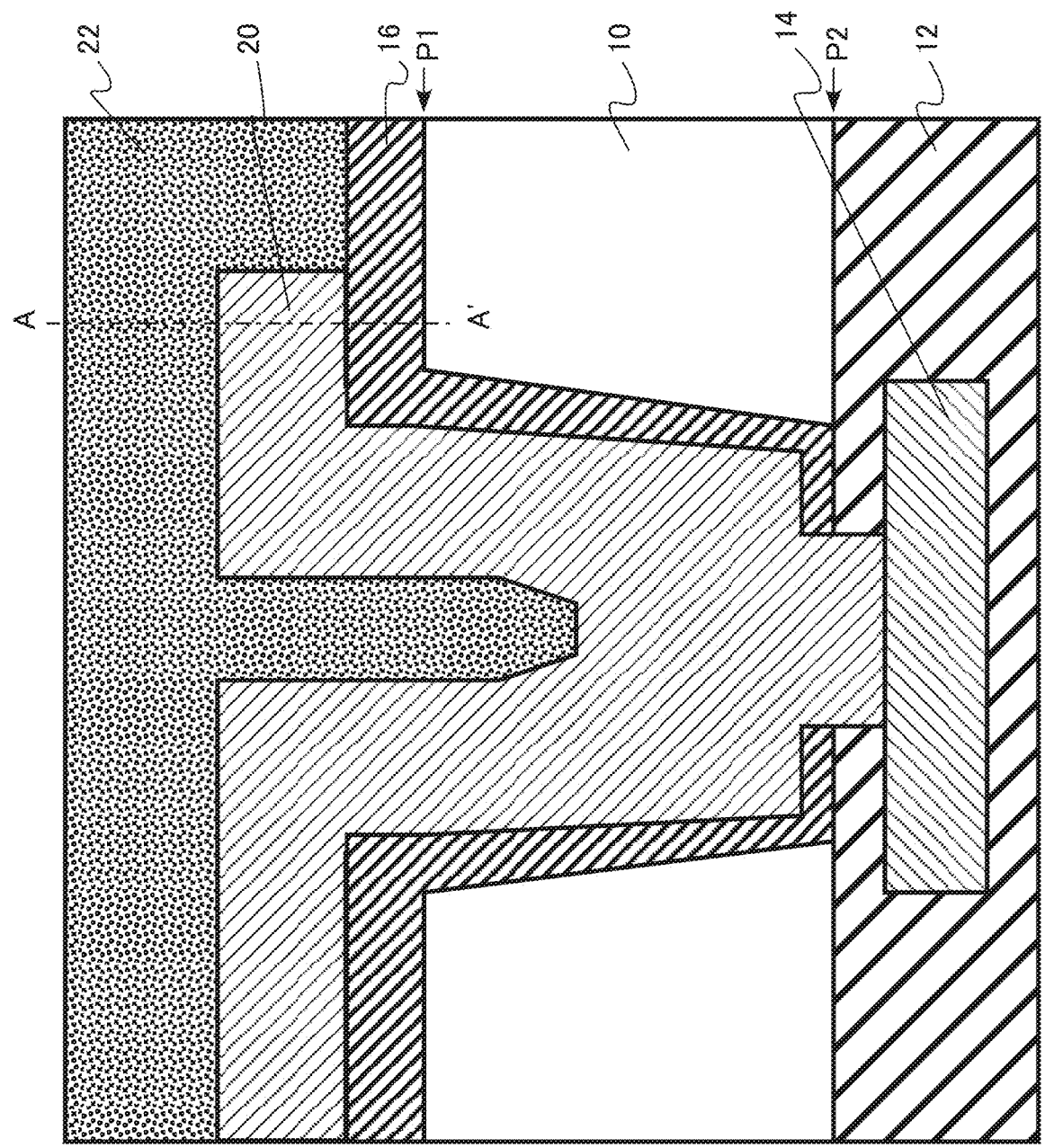
FIG. 13 is an enlarged schematic sectional view of a part of a semiconductor device of a comparative embodiment.

FIG. 13 is an enlarged schematic sectional view of a part of a semiconductor device of a comparative embodiment. The semiconductor device of the comparison form is a photosensor. FIG. 13 is a sectional view of the TSV structure of the photosensor of the comparative embodiment. FIG. 13 is a sectional view corresponding to FIG. 2.

The photosensor of the comparative embodiment is similar to the photosensor 100 of the embodiment except that the silicon nitride layer 18 is not provided.

Figure 14:
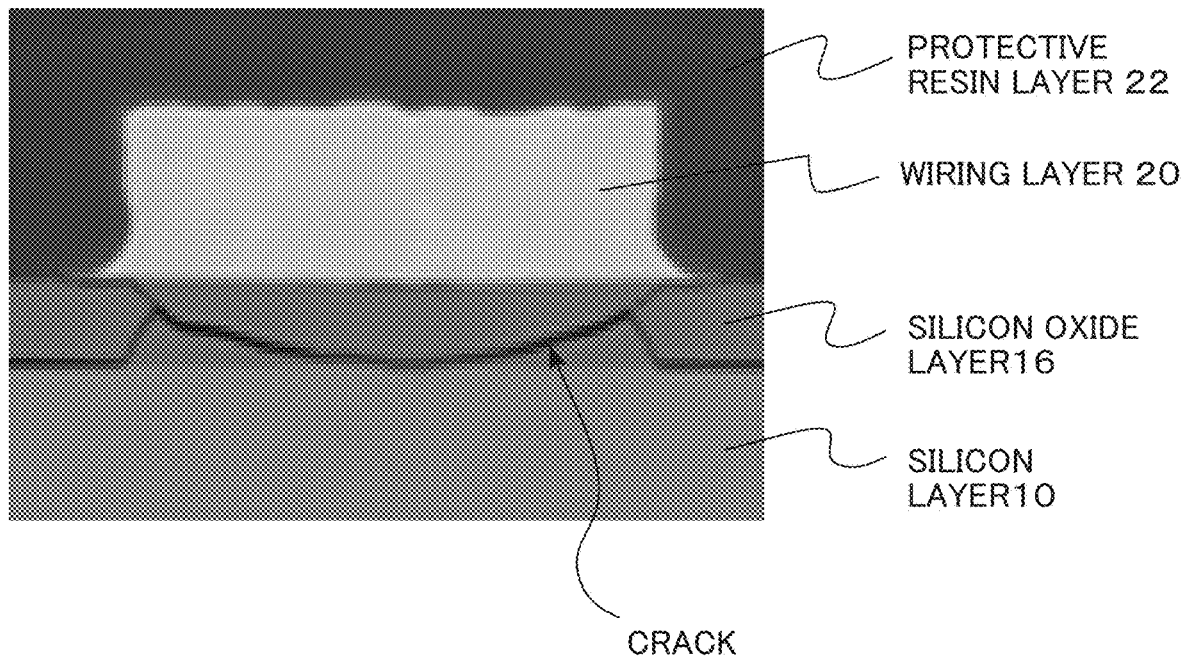
FIG. 14 is a scanning-electron-microscope photograph of a defective portion in the reliability test of the semiconductor device of the comparative embodiment.

FIG. 14 is an SEM photograph of a defective portion in the reliability test of the semiconductor device of the comparative embodiment. FIG. 14 corresponds to the AA' cross section of FIG. 13.

FIG. 14 shows a defective portion in a temperature humidity storage test (THS test) of the photosensor of the comparative embodiment. As shown in FIG. 14, the silicon oxide layer 16 between the silicon layer 10 and the wiring layer 20 is cracked.

It can be inferred that the crack has been generated by the silicon oxide layer 16 absorbing moisture and swelling. For example, the silicon oxide layer 16 under the wiring layer 20 is considered to have small swelling because the wiring layer 20 blocks the passage of moisture. On the other hand, the silicon oxide layer 16 without the wiring layer 20 is considered to absorb a relatively large amount of moisture and have large swelling. Due to the difference in the degree of swelling of the silicon oxide layer 16, it is considered that a large stress is generated and a crack is thereby generated.

In the photosensor of the comparative embodiment, similarly to the photosensor 100 of the embodiment, the resin adhesive layer 26 for boding the glass substrate 24 and the insulating layer 12 is formed before the silicon oxide layer 16 is formed. The heat resistant temperature of the resin of the adhesive layer 26 is, for example, low such as 250° C. or less. Thus, the silicon oxide layer 16 is formed, for example, at a deposition temperature of 250° C. or less. The silicon oxide layer 16 is preferably formed at a deposition temperature of 200° C. or less.

The silicon oxide layer 16 formed at a deposition temperature of 250° C. or lower has a low density and high hygroscopicity as compared to, for example, a silicon oxide layer formed at a temperature of 250° C. or more. For this reason, the resistance to a temperature humidity storage test of a photosensor is lowered.

The photosensor 100 of the embodiment includes the silicon nitride layer 18 having high moisture stopping power on the silicon oxide layer 16. By providing the silicon nitride layer 18 on the silicon oxide layer 16, permeation of moisture is suppressed and swelling of the silicon oxide layer 16 is suppressed. Thus, the resistance to the temperature humidity storage test is increased. Accordingly, the reliability of the photosensor 100 is improved.

The thickness of the silicon nitride layer 18 (d2 in FIG. 2) is preferably thinner than the thickness of the silicon oxide layer 16 (d1 in FIG. 2). If the silicon nitride layer 18 is too thick, the deposition time becomes longer, and the manufacturing cost is increased.

The thickness of the silicon nitride layer 18 is preferably 0.1 μm or more and 1 μm or less. If the thickness is less than the range, the moisture stopping power can be insufficient. If the thickness is greater than the range, the manufacturing cost is increased.

The thickness of the silicon oxide layer 16 (d1 in FIG. 2) is preferably 2 μm or more and 5 μm or less. If the thickness is less than the range, the insulation resistance between the silicon layer 10 and the wiring layer 20 can be insufficient. If the thickness is greater than the range, the manufacturing cost is increased.

The thickness of the silicon nitride layer 18 at the portion where the protective resin layer 22 is in contact with the silicon nitride layer 18 (d3 in FIG. 2) is preferably thinner than, for example, the thickness at the portion where the wiring layer 20 is in contact with the silicon nitride layer 18 (d2 in FIG. 2). In other words, the thickness at the portion where the wiring layer 20 is in contact with the silicon nitride layer 18 is preferably thicker than the thickness of the silicon nitride layer 18 at the portion where the protective resin layer 22 is in contact with the silicon nitride layer 18. By thickening the silicon nitride layer 18 under the wiring layer 20, it is possible, for example, to suppress the diffusion of copper (Cu) contained in the wiring layer 20 into the silicon layer 10.

As described above, according to the semiconductor device of the embodiment, by providing the silicon nitride layer 18, it is possible to implement a semiconductor device capable of improving the reliability.

It has been described that the semiconductor layer is the silicon layer 10 as an example in the embodiment, but it is also possible to use a semiconductor layer formed of a semiconductor other than silicon.

It has been described that the cavity 32 is provided between the glass substrate 24 and the photodiode 10a as an example in the embodiment, but the cavity 32 may not be provided between the glass substrate 24 and the photodiode 10a.

Furthermore, it has been described that the semiconductor device is an photosensor as an example in the embodiment, but the present disclosure is applicable to semiconductor devices other than a photosensor.

While certain embodiments have been described, these embodiments have been presented by way of example only, and are not intended to limit the scope of the inventions. Indeed, the semiconductor device described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer having a first plane, a second plane, and a through hole penetrating from the first plane to the second plane;
an insulating layer provided on a side of the second plane of the semiconductor layer;
a first conductive layer provided in the insulating layer;
a silicon oxide layer provided on a side of the first plane and in the through hole of the semiconductor layer;
a silicon nitride layer provided on the side of the first plane and in the through hole of the semiconductor layer, the silicon oxide layer being interposed between the silicon nitride layer and the semiconductor layer;
a second conductive layer provided on the side of the first plane and in the through hole of the semiconductor layer, the silicon oxide layer and the silicon nitride layer being interposed between the second conductive layer and the semiconductor layer, and the second conductive layer electrically connected to the first conductive layer; and
a first resin layer provided on the side of the first plane of the semiconductor layer, the silicon oxide layer, the silicon nitride layer, and the second conductive layer being interposed between the first resin layer and the semiconductor layer.

2. The semiconductor device according to claim 1, wherein the second conductive layer contains copper (Cu).

3. The semiconductor device according to claim 1, wherein the silicon nitride layer has a thickness thinner than the thickness of the silicon oxide layer.

4. The semiconductor device according to claim 1, wherein the silicon oxide layer is a layer formed at a temperature of 250° C. or less.

5. The semiconductor device according to claim 1, wherein the silicon nitride layer at a portion where the first resin layer is in contact with the silicon nitride layer has a thickness thinner than the thickness of the silicon nitride layer at a portion where the second conductive layer is in contact with the silicon nitride layer.

6. The semiconductor device according to claim 1, wherein the semiconductor layer is silicon.

7. A semiconductor device comprising:
a semiconductor layer having a first plane, a second plane, and a through hole penetrating from the first plane to the second plane;
an insulating layer provided on a side of the second plane of the semiconductor layer;
a first conductive layer provided in the insulating layer;
a silicon oxide layer provided on a side of the first plane and in the through hole of the semiconductor layer;
a silicon nitride layer provided on the side of the first plane and in the through hole of the semiconductor layer, the silicon oxide layer being interposed between the silicon nitride layer and the semiconductor layer;
a second conductive layer provided on the side of the first plane and in the through hole of the semiconductor layer, the silicon oxide layer and the silicon nitride layer being interposed between the second conductive layer and the semiconductor layer, and the second conductive layer electrically connected to the first conductive layer;
a transparent substrate provided on the side of the second plane of the semiconductor layer; and
a second resin layer provided between the transparent substrate and the insulating layer.

8. The semiconductor device according to claim 7, further comprising a photodiode provided on the second plane of the semiconductor layer, wherein a cavity is provided between the transparent substrate and the photodiode.

9. The semiconductor device according to claim 7, wherein the second conductive layer contains copper (Cu).

10. The semiconductor device according to claim 7, wherein the silicon nitride layer has a thickness thinner than the thickness of the silicon oxide layer.

11. The semiconductor device according to claim 7, wherein the silicon oxide layer is a layer formed at a temperature of 250° C. or less.

12. The semiconductor device according to claim 7, further comprising a first resin layer provided on the side of the first plane of the semiconductor layer, the silicon oxide layer, the silicon nitride layer, and the second conductive layer being interposed between the first resin layer and the semiconductor layer.

13. The semiconductor device according to claim 7, wherein the semiconductor layer is silicon.

14. The semiconductor device according to claim 8, further comprising a color filter provided between the transparent substrate and the photodiode.

15. The semiconductor device according to claim 12, wherein the silicon nitride layer at a portion where the first resin layer is in contact with the silicon nitride layer has a thickness thinner than the thickness of the silicon nitride layer at a portion where the second conductive layer is in contact with the silicon nitride layer.

\* \* \* \* \*